(12) United States Patent
Curd et al.

(10) Patent No.: US 6,353,333 B1
(45) Date of Patent: Mar. 5, 2002

(54) SIMPLIFIED 5V TOLERANCE CIRCUIT FOR 3.3V I/O DESIGN

(75) Inventors: Derek R. Curd, Fremont; Hy V. Nguyen, San Jose, both of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/595,780

(22) Filed: Jun. 16, 2000

(51) Int. Cl.$^7$ ........................................... H03K 19/0185
(52) U.S. Cl. ........................... 326/81; 326/83; 326/57
(58) Field of Search .............................. 326/80, 81, 83, 326/86, 56–58; 327/534, 535

(56) References Cited

U.S. PATENT DOCUMENTS

| | | | |
|---|---|---|---|
| 5,451,889 A | * | 9/1995 | Heim et al. ........................ 326/81 |
| 5,532,621 A | * | 7/1996 | Kobayashi et al. ................ 326/81 |
| 5,635,861 A | * | 6/1997 | Chan et al. ........................ 326/81 |
| 5,933,025 A | | 8/1999 | Nance et al. |
| 6,175,952 B1 | * | 1/2001 | Patel et al. ........................ 326/80 |

* cited by examiner

Primary Examiner—Michael Tokar
Assistant Examiner—Don Phu Le
(74) Attorney, Agent, or Firm—Jeanette S. Harms; Bever Hoffman & Harms LLP

(57) ABSTRACT

A low voltage interface circuit with a high voltage tolerance enables devices with different power supply levels to be efficiently coupled together without significant leakage current or damage to the circuits. The interface circuit includes an impedance control circuit, an output buffer, an input buffer, an isolation circuit, and a pullup protection circuit. The output buffer includes a pullup transistor and a pulldown transistor for applying an output signal to an I/O pad. When a high voltage (i.e., higher than the internal voltage of the interface circuit) is applied to the I/O pad, the pullup protection circuit drives the gate of the pullup transistor to the high I/O pad voltage to ensure that no current flows to the positive supply voltage. Also, the isolation circuit couples the high I/O pad voltage to the body (well) of the pullup transistor to prevent leakage current through parasitic diodes formed by the pullup transistor.

11 Claims, 2 Drawing Sheets

US 6,353,333 B1

SIMPLIFIED 5V TOLERANCE CIRCUIT FOR 3.3V I/O DESIGN

BACKGROUND OF THE INVENTION

1. Field of the Invention

The present invention relates to the field of integrated circuits, and more specifically to digital logic input/output terminal circuits for interfacing logic circuits with other integrated circuit chips having more than one power supply level.

2. Related Art

When two digital logic devices having different power supply levels are coupled together, an interface circuit is generally required to prevent damage to transistors in the device having the lower power supply level. The interface circuit should also minimize leakage current and prevent latch-up.

For a given power supply voltage, the electric field strength, i.e. the change in voltage per unit length, that transistors are exposed to increases as the size of the transistors is reduced. Digital semiconductor devices have typically been powered by 5V supplies. The maximum electric field tolerance can be a limiting factor on the minimum transistor size. For example, a typical maximum gate oxide field strength for silicon dioxide gates is about 3 megavolts per centimeter. High electric fields inside a transistor can reduce the mean time to failure, and can destroy transistors when an electric field exceeds the breakdown value for a given material in a transistor, such as the gate oxide in CMOS devices.

To reduce the minimum transistor size imposed by the electric field, certain types of digital logic devices including CMOS devices are now powered with a 3.3V supply rather than a 5V supply. However, these 3.3V digital logic devices must often be connected to logic devices that operate with 5V supplies, such as, for example, TTL devices. Absent some form of protection, the 5V TTL signals can damage the 3.3V digital logic devices.

Programmable devices typically include pins that can be used for input or output signals depending upon how the device is programmed. These pins are called I/O pins or I/O terminals. An interface structure must be provided between the I/O pins and the internal portions of the programmable device. The interface structure operates in two modes: input pin mode (receive mode) and output pin mode (transmit mode). The interface structure receives a data-out signal from the internal portions of the programmable device. In transmit mode, the interface structure buffers the data-out signal and applies it to the I/O pin. The interface structure also provides a data-in signal to the internal portions of the programmable device. In receive mode, the interface structure places the output buffer into a tristate mode, disconnecting it from the I/O pin so that an input signal applied by an external source to the I/O pin does not conflict with the data-out signal. The input signal is then typically buffered to generate the data-in signal.

A 3.3V device can safely drive its own I/O pin during transmit mode. However, when the I/O pin of a 3.3V device is being driven by a neighboring 5V device, the 3.3V device must include protection circuits attached to the I/O pin. One prior art approach to protecting 3.3V digital logic circuits is to provide diodes at the power supply of the 3.3V device to limit the maximum voltage at the I/O pin common to the low and high voltage devices. In these devices when an external voltage is applied to an I/O pin that is sufficiently greater than the power supply voltage, the power supply diode turns on and draws current. This approach has a drawback of creating large leakage currents and increasing the power dissipation. Other approaches to providing an interface between digital logic devices with different voltage tolerance levels suffer from a variety of drawbacks. Some require a 5V power supply, others reduce the noise immunity of the circuit and increase the vulnerability of the circuit to latchup, and still others require costly fabrication processes to produce a plurality of types of transistors of the same polarity with different threshold levels. Thus, an improved low voltage I/O circuit with a high voltage tolerance that avoids these and other prior art problems is needed.

SUMMARY OF THE INVENTION

The present invention provides a low voltage interface circuit with a high voltage tolerance. The present invention enables devices with different power supply levels to be efficiently coupled together without damage to the circuits of the low voltage device and without significant leakage current. By minimizing the gate oxide voltage drop in any one transistor, the present invention allows a single thinner gate oxide to be used in the interface circuit. Yet the same process technology can be used for the interface circuit as is used for the rest of the device, so manufacturing cost is kept low.

An interface circuit in accordance with the present invention comprises an impedance control circuit, an output buffer, an input buffer, an isolation circuit, and a pullup protection circuit. The circuit operates in two modes: input and output. Setting a tristate terminal to a low logic level places the interface circuit into a transmit or output mode and enables the output buffer. In transmit mode, the logic level at a data terminal is transmitted to an I/O pad. An embodiment of the present invention provides a buffered data path from the data terminal to the I/O pad. Setting the tristate terminal to a high logic level places the interface circuit into a receive or input mode and disables the output buffer.

When a high voltage (i.e., higher than the internal voltage of the interface circuit) is applied to the I/O pad, two problems can arise. First, the high voltage can create a damaging voltage potential across the gate oxides of transistors in the interface circuit, such as the pulldown transistor in the output buffer. Second, the high voltage can cause reverse current flow into the positive supply voltage of the interface circuit, for example through the pullup transistor of the output buffer.

Therefore, in accordance with the present invention, the output buffer includes an isolation transistor in series with the pulldown transistor to prevent excessive voltage across the gate oxide of the pulldown transistor. Also, the pullup protection circuit drives the gate of the pullup transistor to the high I/O pad voltage to ensure that no current flows to the positive supply voltage. Finally, the isolation circuit couples the high I/O pad voltage to the body (well) of the pullup transistor to prevent leakage current through parasitic diodes formed by the pullup transistor. In this manner, the present invention protects the interface circuit transistors from damage by high voltages at the I/O pad and avoids the large leakage currents of prior art circuits that have forward bias diodes at the power supply of the lower voltage circuit.

In a 3.3 volt circuit tolerant to 5.5 volt input signals, voltage drops greater than 3.6V (3.3V+10%) at a single transistor are prevented. In the input mode, when the externally applied voltage at the I/O pad is sufficiently below the positive supply voltage of the interface circuit, the isolation circuit drives the well voltage to approximately the positive supply voltage (e.g., 3.3V) and reverse biases the parasitic diode associated with the well, thereby ensuring that the well stays sufficiently biased and thus protecting the internal gate oxides from voltage differences greater than 3.6V. The interface circuit of the present invention can be used to couple circuits that have different power supply and logic levels as long as the ratio of voltage levels is not greater than 2:1. For example, the present invention can be used in a semiconductor device with a 2.5V power supply to couple it to a device with a 3.3V power supply.

The present invention will be more fully understood in view of the following description and drawings.

DETAILED DESCRIPTION OF THE DRAWINGS

Figure 1:
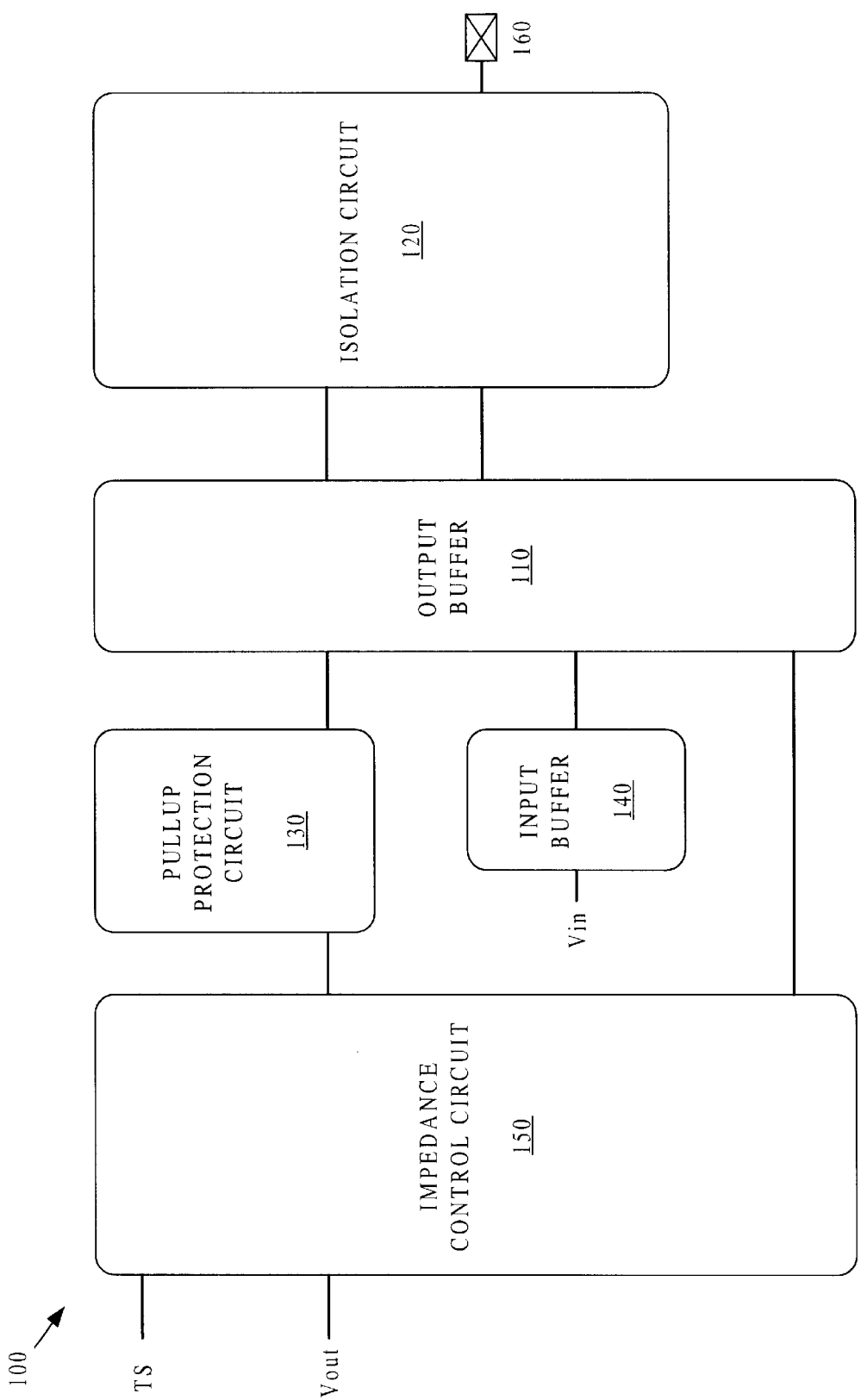
FIG. 1 is a block diagram of the present invention.

FIG. 1 shows a block diagram of an interface circuit 100 in accordance with the present invention. An interface pad 160 can be used as either an input or output pin. The structure must include output drivers for providing pullup and pulldown signals when pad 160 is used as an output pin.

When pad 160 is used as an input pin, it may supply a higher voltage than the output drivers and other internal structures are designed for. Therefore, these output drivers and other structures must be protected. When voltage Vpad on pad 160 is higher than the internal supply voltage (Vcc), an isolation circuit 120 shifts the level of the input signal, and a buffered input signal Vin is generated by an input buffer circuit 140. At the same time, a pullup protection circuit 130 prevents current flow from the high input voltage on pad 160 to Vcc. In one embodiment, if the internal voltage is 3.3 volts and a maximum external voltage up to 5.5 volts is applied to pad 160, then all transistors in interface circuit 100 are protected from a voltage drop of greater than 3.6 volts.

An impedance control circuit 150 receives a data signal Vout and is controlled by a tristate control signal TS. When pad 160 is being used as an output pin, tristate control signal TS couples impedance control circuit 150 to an output buffer circuit 110 to drive pad 160. When pad 160 is being used as an input pin, tristate control signal TS disconnects signal Vout from output buffer circuit 110.

Figure 2:
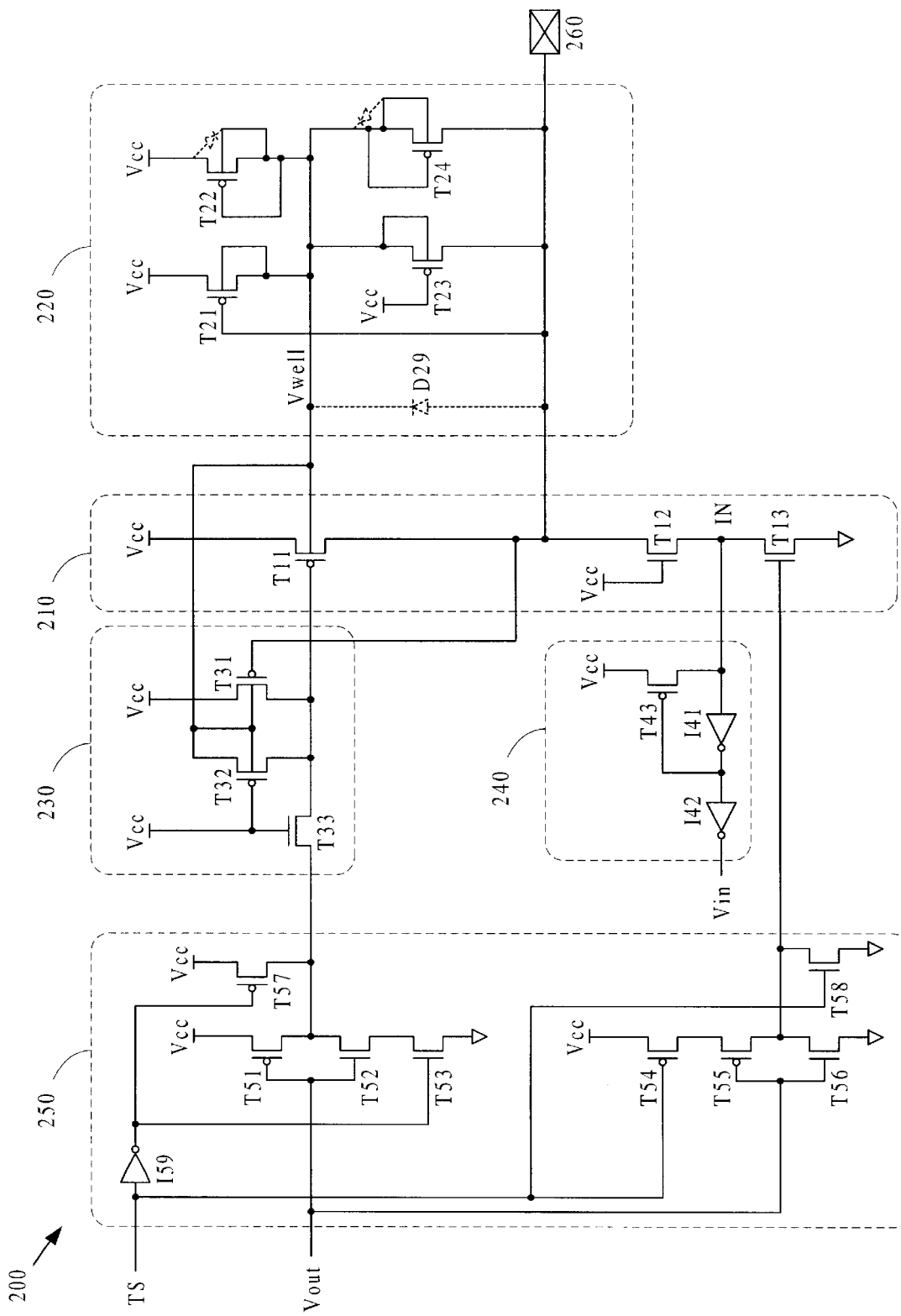
FIG. 2 is a schematic diagram of an embodiment of the present invention.

FIG. 2 shows an interface circuit 200 in accordance with an embodiment of the present invention. Interface circuit 200 comprises an output buffer 210, an isolation circuit 220, a pullup protection circuit 230, an input buffer 240, an impedance control circuit 250, and an I/O pad 260. A tristate control signal TS determines whether interface circuit 200 is in transmit mode for using pad 260 as an output pin (TS is low) or in receive mode for using pad 260 as an input pin (TS is high). A signal Vout provides a data signal that is provided at pad 260 during the transmit mode. Signal Vin is provided as an input signal from data applied to pad 260 during the receive mode.

Output Buffer 210

Output buffer 210 includes a PMOS pullup transistor T11, an isolation transistor T12, and an NMOS pulldown transistor T13. Transistors T11–T13 are serially connected between Vcc and ground. Transistors T11 and T13 provide the output signal when pad 260 is being used as an output pin. The gate of isolation transistor T12 is coupled to voltage Vcc and therefore is always conducting. The operation of output buffer 210 is described in detail below.

Input Buffer 240

Input buffer 240 comprises inverters I41 and I42 and PMOS pullup transistor T43. When pad 260 voltage is 0 volts, the signal IN supplied by transistor T12 has a voltage of 0 volts. When pad 260 voltage is between about 2.6 volts and 5.5 volts, the signal IN has a voltage of Vcc–Vt or about 2.6 volts (3.3–0.7=2.6, wherein 0.7 is the threshold drop of transistor T12). A voltage of 2.6 volts will be recognized by inverter I41 as a high logic level, but may cause some DC current flow through inverter I41. To eliminate this DC current flow, pull-up transistor T43 is turned on by the low output voltage from inverter I41 and pulls up the voltage at IN to Vcc. The size of transistor T43 is selected so that a switching I/O pin signal overrides the Vcc value placed on the input terminal of inverter I41. Inverter I42 provides further buffering and switches the Vin signal to the same polarity as the input voltage at pad 260.

Impedance Control Circuit 250

In impedance control circuit 250, transistors T51, T52 and T53 form a first data-out pre-driver buffer. Similarly, transistors T54, T55 and T56 form a second data-out pre-driver buffer. The pre-driver buffers are controlled by the tri-state signal TS. When pad 260 is an input pin (receive mode), tristate signal TS is high. A high TS signal turns off PMOS transistor T54 and the inverted tristate signal (provided by inverter I59) turns off NMOS transistor T53. When transistors T53 and T54 are off, the pre-driver buffer including transistors T51, T52, and T53 and the pre-driver buffer including transistors T54, T55, and T56 are disabled. The high TS signal turns on transistor T58, and the inverted TS signal (provided by inverter I59) turns on transistor T57. Consequently, transistor T57 provides a high signal (via conducting transistor T33) to PMOS pullup transistor T11, and transistor T58 provides a low signal to NMOS pulldown transistor T13. Thus, when pad 260 is an input pin, transistors T11 and T13 of output buffer 210 are off.

When pad 260 is used as an output pin, tristate control signal TS is low, thereby turning on transistors T53 and T54 and turning off transistors T57 and T58. In this manner, the first pre-driver buffer comprising transistors T51, T52, and T3 and the second pre-driver buffer comprising transistors T54, T55, and T56 are enabled and operate as inverters.

In this configuration, in response to a high Vout signal, transistors T52 and T56 turn on, whereas transistors T51 and T55 turn off, thereby providing low signals to the gates of transistor T11 and T13. These low signals turn on transistor T11 and turn off transistor T13. Therefore, transistor T11 pulls up pad 260 to voltage Vcc.

In response to a low Vout signal, transistors T51 and T55 are on, whereas transistors T52 and T56 are off, thereby providing high signals to the gates of transistors T11 and T13. These high signals turn on transistor T13 and turn off transistor T11. Therefore, transistor T13 pulls down pad 260 to ground.

Thus, when interface circuit 200 is in transmit mode, impedance control circuit 250 and output buffer 210 provide output signals at pad 260 corresponding to Vout.

Protection of Output Buffer 210

Pulldown transistor T13 must be protected when pad 260 is used as an input pin and carries a voltage up to 5.5 volts. Isolation transistor T12 has its gate connected to Vcc (3.3 volts) and thus the voltage at the drain of T13 is no more than Vcc minus one NMOS threshold drop (or about 3.3–0.7=2.6 volts). Therefore neither transistor T13 nor inverter I41 (in input buffer 240) will experience damaging voltage levels.

Pullup transistor T11 must be prevented from conducting current to Vcc when pad 260 is used as an input pin and carries a voltage up to 5.5 volts. Conventional output buffers provide this protection by including a second PMOS transistor in series with a PMOS pullup transistor. An example of such a configuration is described in co-owned U.S. Pat. No. 5,933,025, issued Aug. 3, 1999 to Nance et al. However, each of the P-channel devices halves the drive strength of the transistor series, thereby requiring devices four times the size of a comparably performing solitary device. Therefore the use of a single pullup transistor in the present invention advantageously enables a significant reduction in circuit layout area.

When the voltage on pad 260 is high (5.5 volts), transistor T11 must prevent current from flowing from pad 260 to the Vcc terminal. Specifically, the gate voltage on PMOS transistor T11 must be sufficiently high to turn off transistor T11 (no lower than one threshold below pad 260 voltage, for example 5.5−0.7=4.8 volts). In addition, when the voltage on pad 260 is high (5.5 volts), current can flow through parasitic diodes formed between the P-type drains of PMOS transistors connected to pad 260 and the N-well in which those drains are formed. This current flow can lead to excessive power dissipation and improper functioning of the transistors. Therefore, if the voltage on pad 260 is equal to or greater than Vcc, then the N-well voltage (labeled Vwell in FIG. 2) for the PMOS transistors connected to pad 260 must be at least within one threshold voltage of the voltage on pad 260. These protective functions are provided by isolation circuit 220 and pullup protection circuit 230.

Isolation Circuit 220

Isolation circuit 220 comprises PMOS transistors T21–24. The body terminals of transistors T21–24 are all coupled to Vwell. Transistor T21 is connected between voltage Vcc and Vwell, and is gate-coupled to pad 260. Transistor T22 is connected between voltage Vcc and Vwell, and is gate-coupled to Vwell. Transistor T23 is connected between Vwell and pad 260, and is gate-coupled to voltage Vcc. Finally, transistor T24 is connected between Vwell and pad 260, and is gate-coupled to Vwell.

In accordance with the present invention, transistors T21–T24 turn on/off at various times depending on the voltage on pad 260. Four voltage ranges are described. In the first voltage range, the voltage on pad 260 is between zero and one P-channel threshold voltage less than the internal voltage Vcc (Vcc−Vtp). This first voltage range turns on transistor T21, thereby providing a Vcc voltage on Vwell and reverse biasing diode D29. Note that transistor T22 may be turned on if the starting voltage on Vwell is low or turned off if the starting voltage on Vwell is high. However, transistors T23–T24 remain turned off in this first voltage range. Thus, the voltage on Vwell remains at Vcc.

In the second voltage range, the voltage on pad 260 is between Vcc−Vtp and Vcc. This second voltage range turns off transistor T21. However, if Vwell drops below Vcc, then transistor T22 ensures that Vwell maintains at least a Vcc−Vtd voltage (Vtd is the threshold voltage associated with the diode of transistor T22) and diode D29 remains reverse biased. Thus, in this configuration, transistor T22 functions as a clamp. Note that transistors T23–T24 remain turned off in this second voltage range.

In the third voltage range, the voltage on pad 260 is between Vcc and one P-channel threshold voltage above the internal voltage Vcc (Vcc+Vtp). This third voltage range would tend to forward bias diode D29. However, transistor T24 turns on at this point, transistor T22 turns off, and transistors T21 and T23 remain off. In this manner, Vwell is pulled up to the voltage Vpad on pad 260 less one threshold voltage drop Vtd (associated with the parasitic diode of transistor T24), thereby ensuring no forward biasing of diode D29.

In the fourth voltage range, the voltage on pad 260 is greater than Vcc+Vtp. This fourth voltage range would also tend to forward bias diode D29. However, in this range, transistor T23 turns on, thereby pulling up Vwell to Vpad. Transistor T24 is turned on until Vwell reaches Vpad−Vtd (the threshold voltage associated with the diode).

Therefore, irrespective of the voltage on pad 260, isolation circuit 220 ensures that the Vwell voltage remains sufficiently high to prevent damage to isolation transistor T11 and avoids forming a current path from pad 260 to Vcc. Moreover, driving Vwell with transistors improves the noise immunity and reduces the vulnerability to latch-up compared to circuits that allow the N-well to be charged only through a parasitic diode. Driving Vwell with transistors also contributes to the fast switching speed of the circuit.

Pullup Protection Circuit 230

Pullup protection circuit 230 comprises a gate latch transistor T31, a gate pullup transistor T32, and an NMOS pass transistor T33. Transistors T31 and T32 are both PMOS devices having body terminals coupled to Vwell. Transistor T31 is connected between voltage Vcc and the gate of pullup transistor T11. The gate of transistor T31 is coupled to pad 260. Transistor T32 is connected between the body and gate terminals of pullup transistor T11. The gate terminal of transistor T32 is connected to voltage Vcc. Finally, pass transistor T33 is connected between control circuit 250 and the gate terminal of pullup transistor T11. The gate terminal of pass transistor T33 is coupled to voltage Vcc, therefore pass transistor T33 is conducting.

During transmit mode, a high output signal from control circuit 250 to the gate of pullup transistor T11 is reduced by one threshold voltage drop by NMOS pass transistor T33. However, in this case, a high signal is also provided to the gate of transistor T13, thereby turning on that transistor and providing a low signal on pad 260 as well as on the gate of transistor T31. In this manner, transistor T31 also turns on and pulls the voltage received by the gate terminal of pullup transistor T11 back up to voltage Vcc.

During receive mode, when pad 260 is at a high voltage (e.g., 5.5 volts), transistor T32 applies the same high voltage to the gate of pullup transistor T11 to prevent formation of a current path from a high I/O pin to voltage Vcc. Specifically, isolation circuit 220 raises Vwell to voltage Vpad when pad 260 is at a high voltage (e.g., 5.5 volts) (described in detail above). When Vwell is more than one P-channel threshold voltage above voltage Vcc, transistor T32 has this high voltage on its body and source terminal and voltage Vcc on its gate. In this configuration, transistor T32 turns on and pulls the gate voltage of transistor T11 to the high voltage on pad 260. Therefore, pullup transistor T11 is turned fully off, thereby preventing any current flow to voltage Vcc. Also, because the gate terminal of transistor T31 is coupled to pad 260, transistor T31 is also fully off and does not provide a current path to voltage Vcc. Finally, pass transistor T33 has its gate connected to Vcc (3.3 volts) and thus the voltage at the drain of transistor T33 (at impedance control circuit 250) is no more than Vcc minus one NMOS threshold drop (or about 3.3−0.7=2.6 volts). Thus transistors T51 and T57 (in impedance control circuit 250) will not provide a current path between a high voltage input (e.g., 5.5 volts) and voltage Vcc.

Fabrication

The present invention interface circuit can be fabricated using NMOS transistors having a single turn-on threshold voltage and PMOS transistors having a single turn-on threshold voltage. This configuration reduces the cost of fabrication of the present invention over prior art circuits that require NMOS and PMOS transistors having different turn-on threshold voltages. While FIG. 2 shows an N-well technology embodiment, it is understood that the present invention can also be created using other technologies, for example, a dual-well technology.

Voltage Levels

Although the invention has been described in connection with several embodiments, it is understood that this invention is not limited to the embodiments disclosed, but is capable of various modifications which would be apparent to a person skilled in the art. For example, while the present invention has been described by reference to a 3.3 volt internal voltage and a 5.5 volt input voltage, it is understood that the protection method of the present invention can be sized for various other voltage levels (i.e., 2.5 volt internal/3.3 volt input, etc.) Thus, the invention is limited only by the following claims.

What is claimed is:

1. An interface circuit that operates in response to a positive supply voltage and a ground supply voltage, the interface circuit comprising:
   an input/output (I/O) pin for providing a connection to an external circuit;
   an output buffer coupled to the I/O pin, the output buffer comprising a PMOS pullup transistor, an NMOS pulldown transistor, and a NMOS isolation transistor, the PMOS pullup transistor being coupled between the positive supply voltage and the I/O pin, the NMOS isolation transistor being coupled between the I/O pin and the NMOS pulldown transistor and being gate-coupled to the positive supply voltage, and the NMOS pulldown transistor being coupled between the NMOS isolation transistor and the ground supply voltage;
   an impedance control circuit connected to the output buffer, the impedance control circuit being coupled to receive a tristate signal and a data out signal, the impedance control circuit enabling one of the PMOS pullup transistor and the NMOS pulldown transistor and disabling the other one of the PMOS pullup transistor and the NMOS pulldown transistor when the tristate signal is at a first state, and the impedance control circuit disabling the PMOS pullup transistor and the NMOS pulldown transistor when the tristate signal is at a second state;
   an isolation circuit coupled between the output buffer and the I/O pin, the isolation circuit comprising:
      a first PMOS transistor connected between the positive supply voltage and the body of the PMOS pullup transistor, the body of the first PMOS transistor being connected to the body of the PMOS pullup transistor and the gate of the first PMOS transistor being connected to the I/O pin;
      a second PMOS transistor connected between the positive supply voltage and the body of the PMOS pullup transistor, the body and the gate of the second PMOS transistor being connected to the body of the PMOS pullup transistor;
      a third PMOS transistor connected between the body of the PMOS pullup transistor and the I/O pin, the body of the third PMOS transistor being connected to the body of the PMOS pullup transistor, and the gate of the third PMOS transistor being connected to the positive supply voltage; and
      a fourth PMOS transistor connected between the body of the PMOS pullup transistor and the I/O pin, the body and the gate of the fourth PMOS transistor being connected to the body of the PMOS pullup transistor; and
   a pullup protection circuit coupled between the impedance control circuit and the output buffer, the pullup protection circuit comprising:
      an NMOS pass transistor connected between the impedance control circuit and the gate of the PMOS pullup transistor, the gate of the NMOS pass transistor being coupled to the positive supply voltage;
      a fifth PMOS transistor connected between the positive supply voltage and the gate of the PMOS pullup transistor, the body of the fifth PMOS transistor being connected to the body of the PMOS pullup transistor, and the gate of the fifth PMOS transistor being connected to the I/O pin; and
      a sixth PMOS transistor connected between the body and the gate of the PMOS pullup transistor, the body of the sixth PMOS transistor being connected to the body of the PMOS pullup transistor, and the gate of the sixth PMOS transistor being coupled to the positive supply voltage.

2. The interface circuit of claim 1, wherein when a voltage on the I/O pin is less than 5.5 Volts and the positive supply voltage is approximately 3.3 Volts, the voltage drop across the gate to bulk, gate to drain and gate to source of any of said plurality of transistors is less than 3.6 Volts.

3. An interface circuit that operates in response to a positive supply voltage and a ground supply voltage and is configurable to form an input circuit or an output circuit of an integrated circuit, the interface circuit comprising:
   an input/output (I/O) pin;
   an output buffer for applying an output signal to the I/O pin, the output buffer comprising a first PMOS pullup transistor coupled between the positive supply voltage and the I/O pin;
   a well pullup transistor for connecting the body of the first PMOS pullup transistor to the I/O pin when an external voltage applied to the I/O pin is greater than the positive supply voltage;
   a gate pullup transistor for connecting the gate of the first PMOS pullup transistor to the I/O pin when an external voltage applied to the I/O pin is greater than the positive supply voltage; and
   a PMOS gate latch transistor, the PMOS gate latch transistor being connected between the positive supply voltage and the gate of the first PMOS pullup transistor, the gate of the PMOS gate latch transistor being coupled to the I/O pin, and the body of the PMOS gate latch transistor being coupled to the body of the first PMOS pullup transistor.

4. The interface circuit of claim 3, wherein the output buffer further comprises:
   an NMOS isolation transistor, the gate and drain of the NMOS isolation transistor being coupled to the positive supply voltage and the I/O pin, respectively; and
   an NMOS pulldown transistor coupled between the source of the NMOS isolation transistor and the ground supply voltage.

5. The interface circuit of claim 4, further comprising an input buffer, the input buffer comprising:
   a first inverter, the input terminal of the first inverter being connected to the source of the NMOS isolation transistor;
   a second inverter, the input terminal of the second inverter being connected to the output terminal of the first inverter; and a second PMOS pullup transistor connected between the positive supply voltage and the source of the NMOS isolation transistor, the gate of the second PMOS pullup transistor being coupled to the output terminal of the first inverter.

6. The interface circuit of claim 3, wherein the well pullup transistor comprises a first PMOS device connected between the I/O pin and the body of the first PMOS pullup transistor, the gate of the first PMOS device being coupled to the positive supply voltage, and the body of the first PMOS device being coupled to the body of the first PMOS pullup transistor.

7. The interface circuit of claim 3, wherein the gate pullup transistor comprises a first PMOS device connected between the gate and body of the first PMOS pullup transistor, the gate of the first PMOS device being coupled to the positive supply voltage, and the body of the first PMOS device being coupled to the body of the first PMOS pullup transistor.

8. The interface circuit of claim 7 further comprising:
   an NMOS pass transistor, the source of the NMOS pass transistor being coupled to the gate of the first PMOS pullup transistor, and the gate of the NMOS pass transistor being coupled to the positive supply voltage.

9. The interface circuit of claim 8, wherein the well pullup transistor comprises a second PMOS device connected between the I/O pin and the body of the first PMOS pullup transistor, the gate of the second PMOS device being coupled to the positive supply voltage, and the body of the second PMOS device being coupled to the body of the first PMOS pullup transistor.

10. The interface circuit of claim 9, wherein the output buffer further comprises:
   an NMOS isolation transistor, the gate and drain of the NMOS isolation transistor being coupled to the positive supply voltage and the I/O pin, respectively; and
   an NMOS pulldown transistor coupled between the source of the NMOS isolation transistor and the ground supply voltage.

11. The interface circuit of claim 10, further comprising an input buffer, the input buffer comprising:
   a first inverter, the input terminal of the first inverter being connected to the source of the NMOS isolation transistor;
   a second inverter, the input terminal of the second inverter being connected to the output terminal of the first inverter; and
   a second PMOS pullup transistor connected between the positive supply voltage and the source of the NMOS isolation transistor, the gate of the second PMOS pullup transistor being coupled to the output terminal of the first inverter.

* * * * *